(12) United States Patent
Choi et al.

(10) Patent No.: US 9,177,920 B2
(45) Date of Patent: Nov. 3, 2015

(54) THIN FILM TRANSISTOR ARRAY SUBSTRATE, METHOD OF MANUFACTURING THE SAME, AND DISPLAY DEVICE

(71) Applicant: BOE TECHNOLOGY GROUP CO., LTD., Beijing (CN)

(72) Inventors: Hyun Sic Choi, Beijing (CN); Zhiqiang Xu, Beijing (CN); Hui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/503,761

(22) Filed: Oct. 1, 2014

(65) Prior Publication Data

US 2015/0014868 A1 Jan. 15, 2015

Related U.S. Application Data

(63) Continuation of application No. 13/991,724, filed as application No. PCT/CN2012/086503 on Dec. 13, 2012, now Pat. No. 8,877,649.

(30) Foreign Application Priority Data

Apr. 27, 2012 (CN) .......................... 2012 1 0129992

(51) Int. Cl.
*H01L 21/311* (2006.01)
*H01L 27/01* (2006.01)
(Continued)

(52) U.S. Cl.
CPC .......... *H01L 23/544* (2013.01); *G02F 1/13394* (2013.01); *G02F 1/133711* (2013.01); *G02F 1/136227* (2013.01); *H01L 21/76802* (2013.01); *H01L 27/1214* (2013.01); *H01L 27/1248* (2013.01); *H01L 27/1288* (2013.01); *G02F 2001/136236* (2013.01); *H01L 2223/54426* (2013.01)

(58) Field of Classification Search
CPC ............ H01L 27/1288; H01L 27/1248; H01L 23/544
USPC .......................................... 438/702; 257/347
See application file for complete search history.

(56) References Cited

U.S. PATENT DOCUMENTS

| 7,440,073 B2 | 10/2008 | Sawasaki |
| 2003/0202267 A1 | 10/2003 | Yamasaki et al. |

(Continued)

FOREIGN PATENT DOCUMENTS

| CN | 1447153 A | 10/2003 |
| CN | 1499277 A | 5/2004 |

(Continued)

OTHER PUBLICATIONS

First Chinese Office Action dated Mar. 12, 2013; Appln. No. 201210129992.9.

(Continued)

*Primary Examiner* — David S Blum
(74) *Attorney, Agent, or Firm* — Ladas & Parry LLP

(57) ABSTRACT

Embodiments of the present invention disclose a thin film transistor array substrate, a method of manufacturing the same, and display device. A method of manufacturing a thin film transistor array substrate, comprises: forming a resin layer on a substrate formed with a thin film transistor array, patterning the resin layer by using a mask process to form a spacer and a contact hole filling layer, the contact hole filing layer is used for filling contact holes on the thin film transistor array substrate; forming an alignment film on the substrate patterning with the spacer and the contact hole filing layer.

19 Claims, 3 Drawing Sheets

(51) Int. Cl.
*H01L 27/12* (2006.01)
*H01L 31/0392* (2006.01)
*H01L 23/544* (2006.01)
*G02F 1/1337* (2006.01)
*G02F 1/1339* (2006.01)
*G02F 1/1362* (2006.01)
*H01L 21/768* (2006.01)

(56) References Cited

U.S. PATENT DOCUMENTS

2004/0135952 A1 7/2004 Kurashina et al.
2004/0262608 A1 12/2004 Kim et al.

FOREIGN PATENT DOCUMENTS

| CN | 1599080 A | 3/2005 |
| CN | 101051160 A | 10/2007 |
| CN | 101387799 A | 3/2009 |
| CN | 101398570 A | 4/2009 |
| CN | 102650786 A | 8/2012 |
| JP | 11-111995 A | 4/1999 |

OTHER PUBLICATIONS

Second Chinese Office Action dated May 23, 2013; Appln. No. 201210129992.9.
Third Chinese Office Action dated Aug. 2, 2013; Appln. No. 201210129992.9.
Fourth Chinese Office Action dated Oct. 21, 2013; Appln. No. 201210129992.9.
Chinese Patent Grant Notification dated Jan. 28, 2014; Appln. No. 201210129992.9.
USPTO NOA mailed Jul. 8, 2014 in connection with U.S. Appl. No. 13/991,724.
USPTO NOA dated Jul. 21, 2014 in connection with U.S. Appl. No. 13/991,724.
USPTO NOA dated Aug. 21, 2014 in connection with U.S. Appl. No. 13/991,724.

THIN FILM TRANSISTOR ARRAY SUBSTRATE, METHOD OF MANUFACTURING THE SAME, AND DISPLAY DEVICE

CROSS-REFERENCE TO RELATED APPLICATION

This application is a continuation of application Ser. No. 13/991,724, now U.S. Pat. No. 8,877,649, filed Jun. 5, 2013, which is a 371 of PCT/CN2012/086503 filed Dec. 13, 2012, all of which claim priority to China patent application 201210129992.9 filed Apr. 27, 2012 the disclosure of which is hereby incorporated in its entirety by reference.

TECHNICAL FIELD

Embodiments of the present invention relate to a thin film transistor array substrate, a method of manufacturing the same and a display device.

BACKGROUND

At present, making an insulating layer on a thin film transistor (TFT) array substrate by using a traditional SiNx process can not emerge a contact hole which is used for connecting a pixel electrode and a drain electrode, as shown in FIG. 1. But, making an insulating layer on the TFT array substrate by using a resin process (Resin PA), as shown in FIG. 2, will emerge a number of contact holes 1 like pixel points. When a subsequent alignment liquid, for example, a PI liquid 2, is applied, the PI liquid 2 will flow into these contact holes, which will induce the reduction in thickness of the alignment film, after the film is cured.

Generally, the size and number of the contact holes are proportional to the reduction in thickness of the polyimide (PI) film, namely, the more and bigger the contact holes are, the more the PI film is reduced in thickness. The number of the contact holes is proportional to the amount of the pixels, in an ordinary resolution of 60-120 PPI, the reduction in thickness of the PI film is not obvious, and it can not bring about obvious defect; but, in the resolution of higher than 1700 PPI, the contact holes, for example, at the depth of 1.5 μm, will cause more reduction in thickness of the PI film, for example, the thickness can be reduced from 800 Å to 450 Å, too thin PI film will cause problems of emerging afterimages and reduction in contrast ratio in images displayed on the liquid crystal device.

In a method of the prior art, in order to avoid the reduction in thickness of the PI film, the proportion of PI in the PI liquid will be typically increased, for example, the proportion of PI in the PI liquid applied on a FFS TFT substrate is typically 5%-6.5%, which is slightly higher than those proportion in the PI liquid applied on a TN TFT substrate. However, the proportion of PI liquid is typically too difficult to be higher than 6.5%. If the proportion of PI liquid is too high and the PI liquid is too viscous, it will induce non-uniform coating of the PI liquid. Therefore, for high resolution TFT substrate, such an approach can not avoid the problems caused from the reduction in thickness of the PI film efficiently.

SUMMARY

To solve the problems of emerging afterimages and reduction in contrast ratio of images induced from the reduction in thickness of the alignment due to the contact holes in prior art, embodiments of the present invention provide a thin film transistor array substrate, a method of manufacturing the same, and a display device.

An embodiment of the present invention provides a method of manufacturing a thin film transistor array substrate, the method comprises:
  forming a resin layer on a substrate formed with a thin film transistor array;
  patterning the resin layer by using a mask process, so as to form a spacer and a contact hole filling layer; the contact hole filing layer is used for filling contact holes on the thin film transistor array substrate;
  forming an alignment film on the substrate formed with the spacer and the contact hole filing layer.

An embodiment of the present invention also provides a thin film transistor array substrate, the array substrate comprises a thin film transistor array and an alignment film, it further comprises:
  a spacer on the thin film transistor array; and
  a contact hole filling layer filled in contact holes of the thin film transistor array substrate;
  the alignment film is formed on the contact hole filling layer and the thin film transistor array.

An embodiment of the present invention also provides a display device, wherein, the display device comprises a thin film transistor array substrate formed in embodiments of the present invention.

BRIEF DESCRIPTION OF THE DRAWINGS

In order to clearly illustrate the technical solution of the embodiments of the present invention, the drawings of the embodiments will be briefly described in the following; it is obvious that the described drawings are only related to some embodiments of the present invention and thus are not limitative of the present invention.

DETAILED DESCRIPTION

In order to make objects, technical details and advantages of the embodiments of the present invention apparent, the technical solutions of the embodiment will be described in a clearly and fully understandable way in connection with the drawings related to the embodiments of the present invention.

It is obvious that the described embodiments are just a part but not all of the embodiments of the present invention. Based on the described embodiments herein, those skilled in the art can obtain other embodiment(s), without any inventive work, which should be within the scope of the present invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The phrases "connect", "connected", etc., are not intended to define a physical connection or mechanical connection, but may include an electrical connection, directly or indirectly. "On," "under," "right," "left" and the like are only used to indicate relative position relationships, and when the position of the object which is described is changed, the relative position relationship may be changed accordingly.

Figure 1:
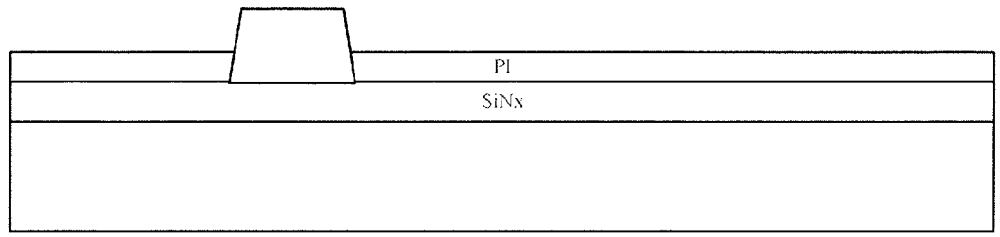
FIG. 1 schematically illustrates a configuration of a TFT array substrate in prior art after the alignment film is formed, wherein the insulating layer formed on the substrate is made of SiNx PA.
Figure 2:
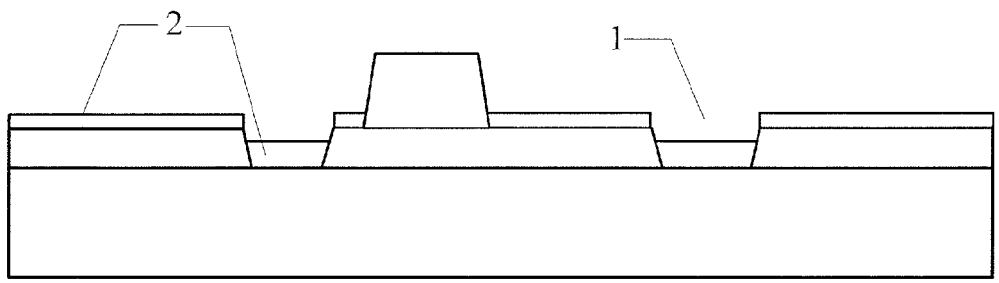
FIG. 2 schematically illustrates a configuration of a TFT array substrate in prior art after the alignment film is formed, wherein the insulating layer formed on the substrate is made of Resin PA.
Figure 3:
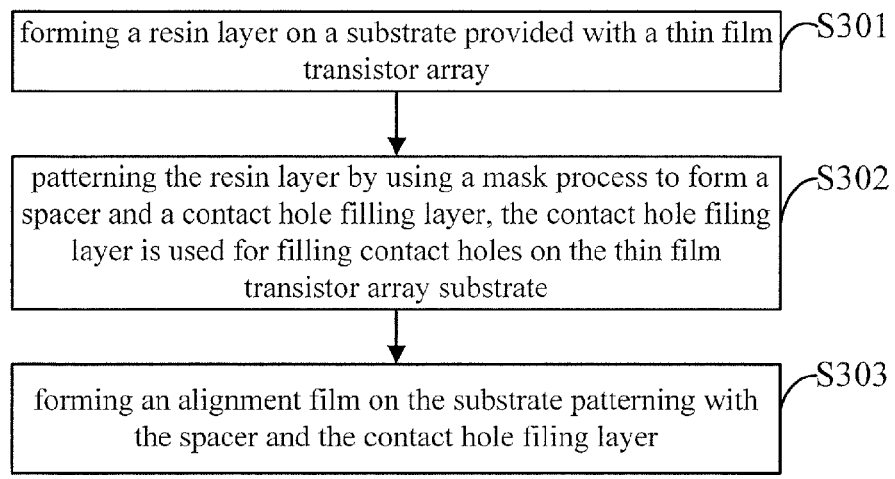
FIG. 3 is a flow diagram schematically illustrating a method of manufacturing a TFT array substrate provided in an embodiment of the present invention.

As shown in FIG. 3, a method of manufacturing a thin film transistor array substrate provided in an embodiment of the present invention comprises steps as below:

Step S301, forming a resin layer on a substrate formed with a thin film transistor array.

Figure 4:
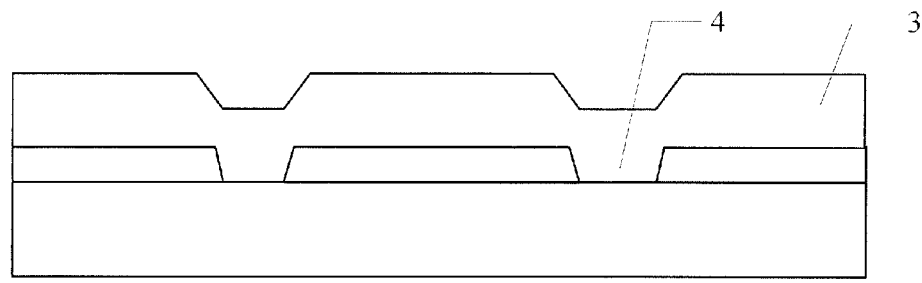
FIG. 4 schematically illustrates a configuration of a TFT array substrate provided in an embodiment of the present invention after the resin layer is formed on the substrate.

As shown in FIG. 4, the thickness of the resin layer 3 is larger than the hole depth of contact holes 4, namely, the resin layer 3 will fully fill the contact holes 4;

Specifically, the resin layer 3, which is formed on the substrate formed with the thin film transistor array, is a layer of photosensitive material.

Wherein, the material of the resin layer 3 may be positive photosensitive material, or may be negative photosensitive material, the formation of the resin layer 3 belong to the prior art, so it will not be described in detail here.

The following steps are described by using the negative photosensitive material as an example, but the present invention is not limited to the negative photosensitive material.

Step S302, patterning the resin layer by using a mask process to form a spacer and a contact hole filling layer;

The contact hole filing layer is used for filling the contact holes on the thin film transistor array substrate;

For example, the thickness of the formed contact hole filling layer is consistent with the depth of the contact holes.

Figure 5:
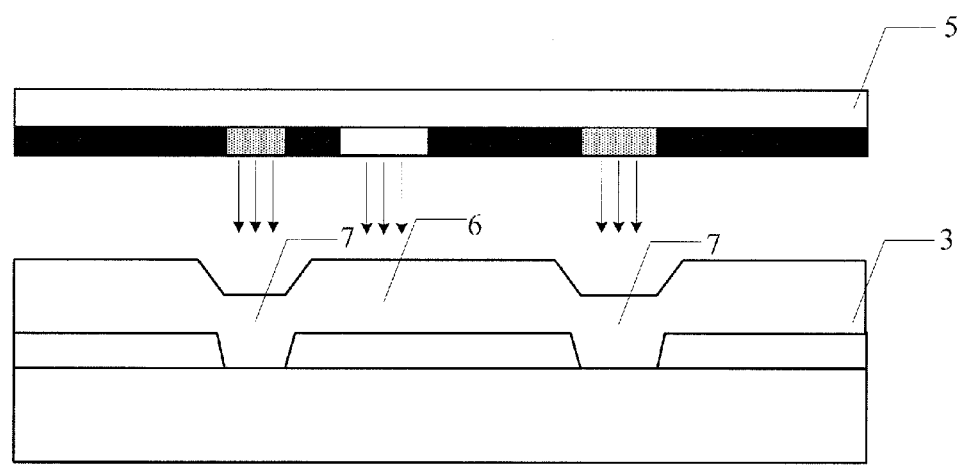
FIG. 5 schematically illustrates a exposure process of a resin layer by using a two-tone mask plate provided in an embodiment of the present invention.

For example, in the step S302, the procedure of patterning the resin layer by using a mask process to form a spacer and a contact hole filling layer comprises:

On the array substrate formed with the resin layer 3, exposing the resin layer 3 by using a two-tone mask plate 5, as shown in FIG. 5; wherein a fully light-transmitting portion of the two-tone mask plate 5 corresponds to a portion 6 of the resin layer 3 for forming the spacer, a partly light-transmitting portion of the two-tone mask plate 5 corresponds to a portion 7 of the resin layer 3 for forming the contact hole filing layer, the fully opaque portion of the two-tone mask plate 5 corresponds to the remaining portion of the resin layer 5 except those serve to form the spacer and the contact hole filling layer; further, the two-tone mask plate 5 can be a half tone mask plate, or a gray tone mask plate.

Since the resin layer 3 is a layer of the negative photosensitive material, therefore, after a light irradiation (shown by the arrow in FIG. 5), i.e. the exposure, is performed, the portion 6 of the resin layer 3, which serves to form the spacer and corresponds to the fully light-transmitting portion of the two-tone mask plate 5, occurs photochemical reaction and forms the required spacer (PS); the portion 7 of the resin layer 3, which serves to form the contact hole filling layer and corresponds to the partly light-transmitting portion of the two-tone mask plate 5, occurs photochemical reaction in a part of the resin therein and forms the contact hole filling layer filling and flattening the contact holes on the thin film transistor array substrate; the portion of the resin layer 3, which corresponds to the fully opaque portion of the two-tone mask plate, does not occur any photochemical reaction, and it will be removed in subsequent operation.

Figure 6:
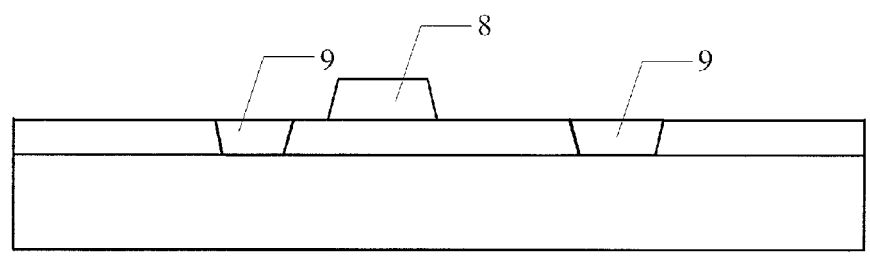
FIG. 6 schematically illustrates a configuration of a TFT array substrate provided in an embodiment of the present invention after a substrate is developed.

Developing the resin layer after the exposure, and removing the resin layer with no photochemical reaction occurs, so as to form the spacer 8 and the contact hole filling layer 9, as shown in FIG. 6. The formed spacer 8 plays a role of the liquid crystal gap during the cell assembly process of the thin film transistor array substrate and a color filter substrate.

For example, during the exposure, the exposure amount of the portion 6 of the resin layer 3 for forming the spacer can be 100%; the exposure amount of the portion 7 of the resin layer 3 for forming the contact hole filling layer can be less than 50%. Moreover, the exposure time is typically controlled to 3-8 seconds, so as to prevent from overexposure, and to insure that the thickness of the contact hole filling layer 9 is consistent with the depth of the contact holes, so that the surface of the contact holes is flush with other regions.

S303, forming an alignment film 10 on the substrate formed with the spacer 8 and the contact hole filing layer 9.

Figure 7:
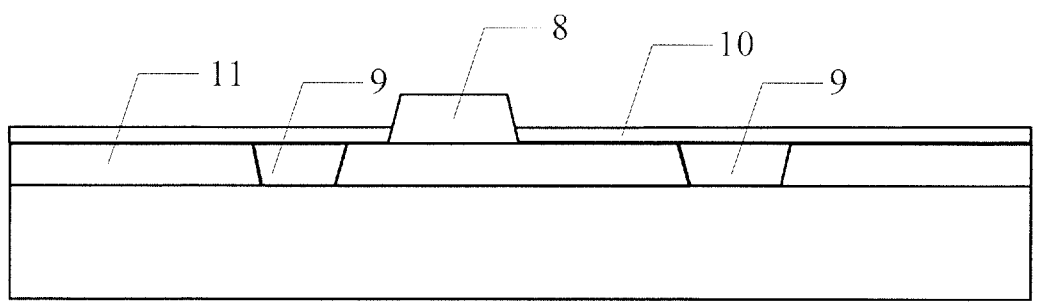
FIG. 7 schematically illustrates a configuration of a TFT array substrate provided in an embodiment of the present invention.

For example the alignment film (PI film), as shown in FIG. 7. It can be seen from the figures that the contact holes have been filled and flattened by the contact hole filing layer 9, therefore, the alignment liquid on the thin film transistor array substrate will not leads to a non-uniform problem, since it doesn't flow into the contact holes. After the uniform alignment liquid is cured, the alignment film 10 with uniform thickness is formed, so that the problems of emerging after-images and non-uniform contrast ratio induced from the reduction in thickness is avoided. As the fabricating process of the alignment film can be a printing or coating process, which is an existing technology, so it will not be described in detail here.

For example, the thickness of the formed alignment film 10 is typically 0.6-0.8 μm.

For example, the process in which the alignment liquid is printed for several times may also be used, so as to assure the thickness of the alignment film.

An embodiment of the present invention also provides a thin film transistor array substrate, as shown in FIG. 7, it comprises a thin film transistor array 11 and the alignment film 10, and further comprises:

the spacer 8 on the thin film transistor array 11; and
the contact hole filling layer 9 filled in the contact holes of the thin film transistor array substrate 11;
wherein the alignment film 10 is formed on the contact hole filling layer 9 and the thin film transistor array 11.

For example, the material of the spacer 8 and the contact hole filing layer 9 in the aforementioned thin film transistor array substrate can be resin material, such as negative photosensitive material or positive photosensitive material.

For example, the thickness of the contact hole filling layer 9 in the aforementioned thin film transistor array substrate is consistent with the depth of the contact holes.

For example, the thickness of the alignment film in the aforementioned thin film transistor array substrate is 0.6-0.8 μm.

An embodiment of the present invention also provides a display device, it comprises the aforementioned thin film transistor array substrate provided in the embodiment of the present invention. The display device can be any products or components having a display function: liquid crystal panel, e-paper, OLED panel, liquid crystal television, liquid crystal display, digital photo frame, mobile phone, or tablet PC.

The embodiments of the present invention provide a thin film transistor array substrate, a method of manufacturing the same, and display device, forming the resin layer on the substrate formed with the thin film transistor array, patterning the resin layer by using the mask process to film the spacer and the contact hole filling layer, the contact hole filing layer is used for filling the contact holes on the thin film transistor array substrate, forming the alignment film on the substrate formed with the spacer and the contact hole filing layer. Since the contact holes are filled with the contact hole filing layer, in the subsequent operation, the alignment liquid can not flow into the contact holes, and the thickness of the alignment film will not be reduced, so that the problems of emerging after-images and reduction in contrast ratio of images are avoided.

What are described above is related to the illustrative embodiments of the disclosure only and not limitative to the scope of the disclosure; the scopes of the disclosure are defined by the accompanying claims.

The invention claimed is:

1. A method of manufacturing a thin film transistor array substrate, comprising:
   forming a resin layer on a substrate formed with a thin film transistor array;
   patterning said resin layer by using a mask process, so as to form a spacer and a contact hole filling layer; said contact hole filing layer is used for filling contact holes on said thin film transistor array substrate;
   forming an alignment film on the substrate formed with said spacer and said contact hole filing layer.

2. The method according to claim 1, wherein the resin layer formed on the substrate formed with the thin film transistor array is a layer of negative photosensitive material.

3. The method according to claim 2, wherein said patterning said resin layer by using the mask process to form the spacer and the contact hole filing layer, comprises:
   on the array substrate formed with said resin layer, exposing said resin layer by using a two-tone mask plate, wherein a fully light-transmitting portion of said two-tone mask plate corresponds to a portion of the resin layer for forming said spacer, a partly light-transmitting portion of said two-tone mask plate corresponds to a portion of the resin layer for forming said contact hole filing layer, the fully opaque portion of said two-tone mask plate corresponds to the remaining portion of the resin layer except those portions for forming said spacer and said contact hole filing layer;
   developing said resin layer after the exposure, so as to form said spacer and said contact hole filling layer.

4. The method according to claim 1, wherein the thickness of said contact hole filling layer is consistent with the depth of said contact holes.

5. The method according to claim 1, wherein the thickness of said alignment film is 0.6-0.8 μm.

6. The method according to claim 2, wherein the thickness of said contact hole filling layer is consistent with the depth of said contact holes.

7. The method according to claim 3, wherein the thickness of said contact hole filling layer is consistent with the depth of said contact holes.

8. A thin film transistor array substrate, comprising:
   a thin film transistor array;
   an alignment film;
   a spacer on said thin film transistor array; and
   a contact hole filling layer filled in contact holes on said thin film transistor array substrate;
   wherein said alignment film is formed on said contact hole filling layer and said thin film transistor array.

9. The array substrate according to claim 8, wherein the material of said spacer and said contact hole filling layer is resin material.

10. The array substrate according to claim 8, wherein the material of said spacer and said contact hole filling layer is negative photosensitive material.

11. The array substrate according to claim 8, wherein the thickness of said contact hole filling layer is consistent with the depth of said contact holes.

12. The array substrate according to claim 8, wherein the thickness of said alignment film is 0.6-0.8 μm.

13. A display device, comprising the thin film transistor array substrate according to claim 8.

14. The array substrate according to claim 9, wherein the material of said spacer and said contact hole filling layer is negative photosensitive material.

15. The array substrate according to claim 9, wherein the thickness of said contact hole filling layer is consistent with the depth of said contact holes.

16. The array substrate according to claim 10, wherein the thickness of said contact hole filling layer is consistent with the depth of said contact holes.

17. The array substrate according to claim 9, wherein the thickness of said alignment film is 0.6-0.8 μm.

18. The array substrate according to claim 10, wherein the thickness of said alignment film is 0.6-0.8 μm.

19. The array substrate according to claim 11, wherein the thickness of said alignment film is 0.6-0.8 μm.

* * * * *